US010652050B2

(12) United States Patent
Bhagwat

(10) Patent No.: US 10,652,050 B2
(45) Date of Patent: May 12, 2020

(54) POWER OVER DATA LINES SYSTEM USING SPLIT OR COUPLED CMCS AND DMCS FOR COUPLING DC VOLTAGE AND ATTENUATING COMMON MODE NOISE

(71) Applicant: Linear Technology Holding LLC, Norwood, MA (US)

(72) Inventor: Gitesh Bhagwat, Santa Barbara, CA (US)

(73) Assignee: Linear Technology Holding LLC, Norwood, MA (US)

( * ) Notice: Subject to any disclaimer, the term of this patent is extended or adjusted under 35 U.S.C. 154(b) by 0 days.

(21) Appl. No.: 16/396,571

(22) Filed: Apr. 26, 2019

(65) Prior Publication Data

US 2019/0342124 A1 Nov. 7, 2019

Related U.S. Application Data

(60) Provisional application No. 62/665,265, filed on May 1, 2018.

(51) Int. Cl.
*H04L 25/02* (2006.01)
*H04B 3/56* (2006.01)
(Continued)

(52) U.S. Cl.
CPC ........ *H04L 25/0272* (2013.01); *G06F 1/3234* (2013.01); *H04B 3/56* (2013.01);
(Continued)

(58) Field of Classification Search
CPC ..... H04B 3/548; H04B 3/56; H04L 12/40045; H04L 25/0264; H04L 25/0272;
(Continued)

(56) References Cited

U.S. PATENT DOCUMENTS 5,659,273 A * 8/1997 Harpham ............ H04L 25/0266
333/177
6,304,065 B1 10/2001 Wittenbreder
(Continued)

FOREIGN PATENT DOCUMENTS

CN 101369480 A 2/2009
CN 105634432 A 6/2016
(Continued)

OTHER PUBLICATIONS

PCT/US2019/029651, "International Search Report and Written Opinion," dated Jul. 19, 2019, 12 pages.
(Continued)

*Primary Examiner* — Young T Tse
(74) *Attorney, Agent, or Firm* — Patent Law Group; Brian D. Ogonowsky

(57) ABSTRACT

A PoDL system conducts differential data and DC power over the same wire pair, and various DC coupling techniques are described that improve DC voltage coupling while attenuating AC common mode noise. Pairs of differential mode chokes (DMCs) are used to share current supplied by a power supply. In one embodiment, one DMC is coupled to the line side of a common mode choke (CMC), and one DMC is coupled to the PHY side of the CMC. The line-side DMC has windings that are loosely magnetically coupled so that DMC does not present a very low impedance to AC common mode noise on the wires. Therefore, the performance of the wires' RC termination circuitry is not adversely affected by the line-side DMC when minimizing reflections of common mode signals. The DMCs may use the same magnetic core, and the CMC may be series CMCs that used the same magnetic core.

24 Claims, 7 Drawing Sheets

(51) Int. Cl.
*H04L 12/40* (2006.01)
*G06F 1/3234* (2019.01)

(52) U.S. Cl.
CPC .... *H04L 12/40045* (2013.01); *H04L 25/0282* (2013.01); *H04L 25/0298* (2013.01)

(58) Field of Classification Search
CPC ............. H04L 25/0276; H04L 25/0282; H04L 25/0298; G06F 11/3234
USPC ............ 375/219, 257, 258; 307/2, 4, 17, 83; 333/119, 131, 35, 172, 24 C; 340/12.31, 340/12.32, 12.37, 12.38, 12.23
See application file for complete search history.

(56) References Cited

U.S. PATENT DOCUMENTS

| | | | |
|---|---|---|---|
| 9,100,105 B2 | 8/2015 | Yamamoto et al. | |
| 9,225,558 B2 | 12/2015 | Schwager et al. | |
| 9,641,221 B2 | 5/2017 | Claret et al. | |
| 9,838,081 B1 | 12/2017 | Hallamasek et al. | |
| 10,075,144 B2 | 9/2018 | Standish | |
| 10,205,539 B2 | 2/2019 | Chini et al. | |
| 10,333,742 B1 | 6/2019 | Bhagwat | |
| 10,382,005 B2 | 8/2019 | Gardner | |
| 10,382,216 B1 | 8/2019 | Bhagwat | |
| 10,404,502 B2 | 9/2019 | Gardner | |
| 2006/0220772 A1 | 10/2006 | Suzuki et al. | |
| 2010/0308851 A1* | 12/2010 | Schwager | H04B 3/46 324/750.02 |
| 2011/0268258 A1* | 11/2011 | Alloin | H04M 3/2209 379/32.04 |
| 2013/0320753 A1 | 12/2013 | Kim et al. | |
| 2016/0314895 A1 | 10/2016 | Shiokawa | |
| 2017/0301455 A1 | 10/2017 | Kobayashi et al. | |
| 2018/0026525 A1 | 1/2018 | Gardner | |
| 2018/0097497 A1 | 4/2018 | Kobayashi et al. | |
| 2019/0199401 A1* | 6/2019 | Pandey | H01F 19/04 |
| 2019/0288862 A1* | 9/2019 | Bhagwat | H04L 12/10 |

FOREIGN PATENT DOCUMENTS

| | | | |
|---|---|---|---|
| DE | 20 2018 101 132 | * | 7/2018 |
| EP | 1830608 A1 | | 9/2007 |

OTHER PUBLICATIONS

PCT/US2019/029656, "International Search Report and Written Opinion," dated Jul. 19, 2019, 13 pages.

\* cited by examiner

POWER OVER DATA LINES SYSTEM USING SPLIT OR COUPLED CMCS AND DMCS FOR COUPLING DC VOLTAGE AND ATTENUATING COMMON MODE NOISE

CROSS-REFERENCE TO RELATED APPLICATIONS

This application is based on and claims priority from U.S. Provisional Application Ser. No. 62/665,265, filed May 1, 2018, by Gitesh Bhagwat, incorporated herein by reference.

FIELD OF THE INVENTION

The invention relates to Power over Data Lines (PoDL) systems, where DC power and differential data are provided over the same twisted wire pair, and, in particular, to techniques for increasing the deliverable DC power, improving the attenuation of common mode noise, and reducing the differential mode insertion loss while easing requirements for a common mode choke (CMC).

BACKGROUND

The US patent application publications 2018/0026525 and 2018/0024620 describe various configurations of PoDL systems that use combinations of CMCs and differential mode chokes (DMCs) to attenuate common mode noise while providing DC power to a twisted wire pair.

FIG. 1 is an example of one type of PoDL system described in the aforementioned publications. A PHY 10 outputs differential data and receives differential data via a conventional Media Dependent Interface (MDI) connector 12 coupled to wires 14 and 16 of a twisted wire pair. PHY 10 represents the physical layer in the OSI model and is a transceiver that typically includes signal conditioning and decoding circuitry for presenting bits to the next stage. The term PHY is a term of art and is defined by various IEEE standards, depending on the particular application. The PHY 10 is typically an integrated circuit. A digital processor (not shown) is coupled to the PHY 10 for processing the data.

The PHY 10 is connected to the MDI connector 12 via a CMC 18 and AC coupling capacitors C1 and C2. Termination resistors R1 and R2 and capacitors C3 and C4 are coupled to the wires 14 and 16, via the MDI connector 12, to eliminate reflections of the common mode noise on the twisted wire pair. The termination circuitry is generally designed to match the common mode impedance of the wire pair for maximum energy absorption and minimum reflectance while preserving the differential mode impedance presented by the transceiver. Other types of termination circuits can also be used.

The CMC 18 is an in-line transformer with two windings, where each winding is in series with a wire in the twisted wire pair. As shown by the dots on the CMC 18 windings, the windings have the same polarity, so the magnetic fields generated by a differential mode signal are substantially cancelled out. Thus, the CMC 18 presents little inductance or impedance to differential-mode currents. Common mode currents, such as ambient noise in the wire pair, however, see a high impedance due to the combined inductances of the windings.

The CMC 18 ideally eliminates or greatly attenuates common mode RF noise while providing no loss for the differential or DC voltage signals.

CMCs must present a low insertion loss to the differential data. However, CMCs have constraints which can impede their performance. Such constraints include inter-winding capacitance, DC resistance (DCR) of the windings, core loss, and limits on the current that can flow through the windings.

A DMC 20 is coupled between the MDI connector 12 and a DC power supply 22. The power supply 22 has a low output impedance as is characteristic of a voltage source. The DMC 20 has windings with opposite polarities (dots on opposite ends). The DMC 20 presents a high impedance to AC differential mode signals while it shunts the common mode signals to the power supply 22 due to its low impedance to common mode signals. Therefore, the combination of the CMC 18 and the DMC 20 can substantially remove AC common mode noise that has been coupled to the wire pair, especially at relatively low frequencies.

Since the DMC 20 improves the AC common mode rejection, the CMC 18 windings can be fabricated to have a lower inductance value, reducing the number of turns required, which affords benefits such as reducing the DCR of the CMC windings and reducing the parasitic capacitance. Alternatively, the CMC inductance can stay the same and the overall AC common mode rejection may be increased by the shunting action of the DMC 20.

However, there still exists a drawback with the configuration of FIG. 1. The DMC 20, in combination with the low impedance to ground of the power supply 22, will likely distort the common mode matching impedance provided by the RC termination circuitry, which was designed to eliminate reflections of the common mode noise signals. In other words, the termination circuitry, comprising the resistors R1 and R2 and capacitors C3 and C4, is designed to have an impedance that prevents reflections of the common mode signals while the low impedance by the DMC 20 to the AC common mode signals causes the resulting termination impedance (created by the RC circuitry and the DMC 20) to not be optimal to eliminate reflections of the AC common mode signals. Therefore, there may be some reflections of the AC common mode noise signals.

One way to avoid the DMC 20 adversely interfering with the operation of the termination circuitry for AC common mode noise signals is to place the DMC 20 on the PHY 10 side of the CMC 18, as shown in FIG. 2. In FIG. 2, the operation of the DMC 20 does not have a significant adverse effect on the RC termination circuitry, but now all the current transmitted by the power supply 22 must flow through the CMC 18, which requires that the CMC 18 be much more robust. Such a robust design requires a lower DC winding resistance and makes the CMC 18 more bulky and expensive compared to the CMC 18 in FIG. 1 for the same power requirements of the powered device (PD) connected to the other ends of the wires 14 and 16.

In FIGS. 1 and 2, the DMC 20 is designed to have a strong magnetic coupling between the windings. This rating is sometimes referred to in the DMC's data sheet as its "coupling coefficient" or the "coefficient of magnetic field coupling." Such a high coupling coefficient is typically greater than 0.95. The absolute value of the coupling coefficient can be derived from the amount of leakage inductance. This leakage inductance translates to a frequency dependent impedance which can be compared to the transmitter's or cable's differential mode or common mode impedance to determine whether this is a low or high enough value. This strong magnetic coupling of the DMC windings is also referred to as the DMC windings being "tightly coupled". By virtue of the tight coupling, such a DMC presents a very low impedance to common mode signals. On the other hand, a loosely coupled DMC has a larger leakage inductance, which presents a higher impedance to common mode signals, so is less effective in shunting common mode signals to ground via the power supply 22.

What is needed is a PoDL termination technique and DC voltage coupling technique that: 1) couples DC power to the wire pair without requiring the CMC to conduct the full current drawn by the powered device (PD); and 2) results in the DMC not presenting a low impedance to ground at the MDI connector for AC common mode noise signals so as not to adversely impact the effectiveness of an RC termination circuit that is designed to minimize reflections on the wire pair.

SUMMARY

In one embodiment of a PoDL system, a PHY has its inputs connected to AC-coupling capacitors to block any DC voltage.

One or two CMCs are connected in series between the capacitors and wires in a twisted wire pair. If two CMCs are used, they may have split windings around the same magnetic core, or they may have separate windings wound around the same core, or they may be separate CMCs coupled in series.

If two CMCs are used, a first DMC is connected to nodes between the two CMCs and also connected to a power supply. The power supply has a low impedance to ground. The first DMC has windings that are tightly coupled, so that the first DMC has a large coefficient of magnetic field coupling, for example, a value greater than 0.95. The first DMC, being tightly coupled, presents a very low impedance between the CMCs and the power supply for AC common mode noise.

A second DMC is connected to nodes of the wire pair, to which is also connected an RC termination circuit that is designed to prevent reflections of common mode signals. The second DMC is also connected to the power supply. The second DMC has windings that are loosely coupled, so that the second DMC has a low coefficient of magnetic field coupling, for example, less than 0.70. The second DMC, being loosely coupled, presents a relatively high impedance between the wires and the power supply for typical AC common mode noise. Since the second DMC (connected at the line side) has a low coupling coefficient and presents a relatively high impedance to the wires when conducting the AC common mode signals, the second DMC does not adversely affect the RC termination circuit's performance, so the termination impedance is preserved. As a result, reflections of the common mode signals are minimized.

On the other hand, the first DMC, having a high coupling coefficient, has a very low impedance to AC common noise so attenuates AC common noise received by the wires and any transmitted AC common noise from the PHY.

Since the first DMC and the second DMC are coupled to the output of the power supply, DC power is coupled to the wire pair by both the first and second DMCs, so the current requirements of the two DMCs are reduced by about half.

If each of the DMCs only conducts about half of the power supply current, the line-side CMC only needs to have half the current rating and can be less expensive. The sharing ratio can be altered for optimized device design. The PHY-side CMC has a very low current requirement since it only conducts the differential data signals.

Tight coupling and loose coupling DMCs are commercially available from various manufacturers. Techniques to adjust the magnetic coupling coefficient of windings are well known in the field of transformer design.

In another embodiment, the two DMCs have windings wound around the same magnetic (e.g., ferrous) core for an increased open circuit inductance, which improves common mode attenuation. The two DMCs may be coupled to respective sides of a single CMC or, if two cascaded CMCs are used, one DMC can be connected to nodes between the CMCs and the other DMC is connected to the wire pair and the RC termination circuitry. The mutually coupled DMCs also help to reduce the differential mode insertion loss of the CMC by allowing the differential mode data signals to circumvent the CMC due to the coupled nature of DMC windings.

Other embodiments are described.

BRIEF DESCRIPTION OF THE DRAWINGS

Elements that are the same or equivalent in the various figures are labelled with the same numerals.

DETAILED DESCRIPTION OF THE EMBODIMENTS

Figure 3:
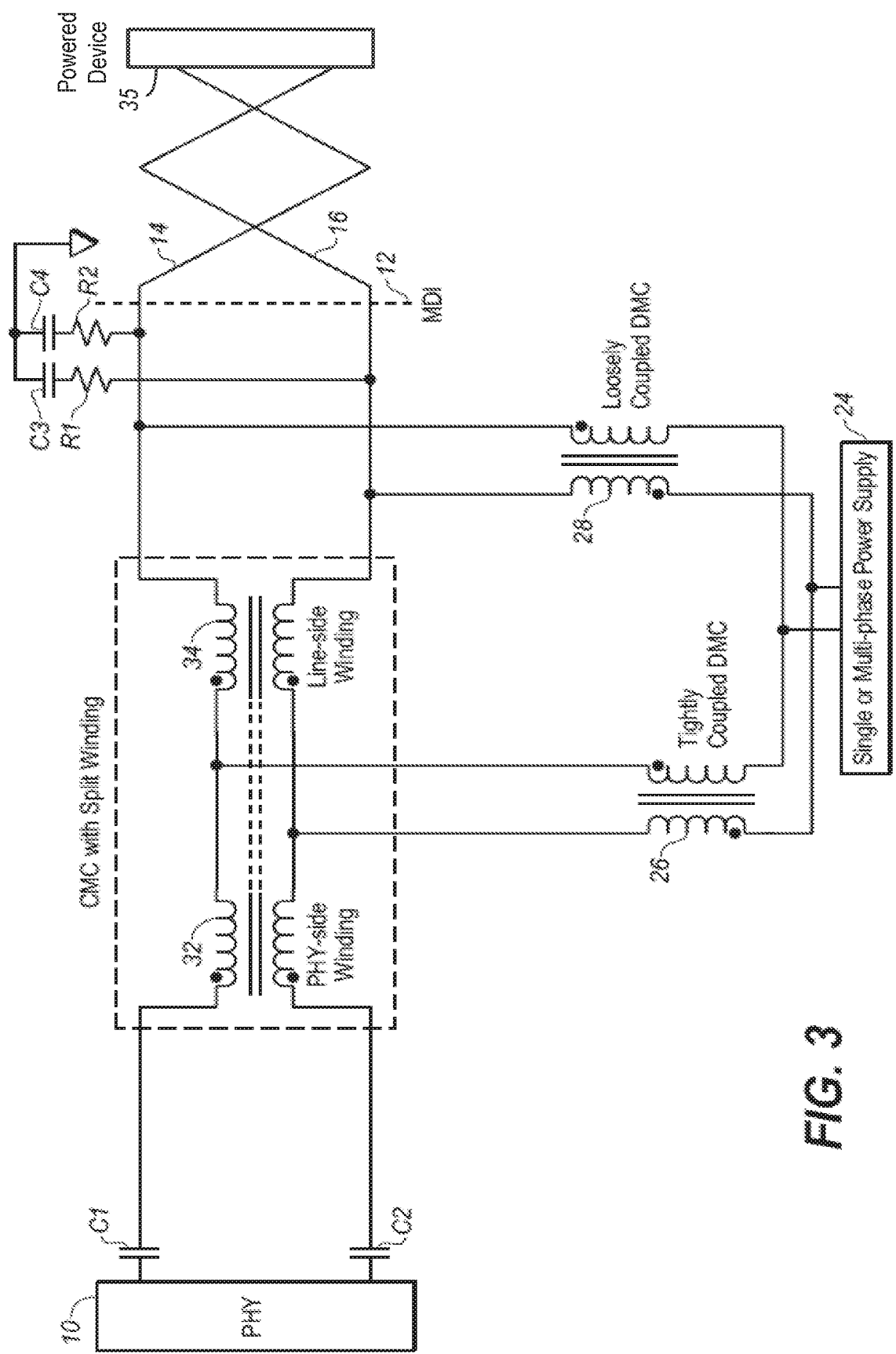
FIG. 3 illustrates a PoDL circuit, in accordance with one embodiment of the invention, using loosely coupled and tightly coupled DMCs along with series CMCs that use the same core and have split windings that are magnetically coupled.

FIG. 3 illustrates one embodiment of the invention.

If the power supply 24 is a multiphase power supply, it can be realized as a voltage source which has a 2-phase output so that a voltage is supplied across the two DMCs 26 and 28. These phases operate in a current sharing mode. The current sharing between the two DMCs 26 and 28 can be equal and can also be changed, by adjusting the multiphase power supply 24, in order to alter the total current through each DMC and the current through the CMC 34 for an optimum design. An example of a multiphase power supply can be a supply made using two LTM8055 regulator modules or two LT3790 controller ICs.

If the power supply 24 is single phase type, the power would be simultaneously supplied to the DMCs 26 and 28, with the current sharing ratio dependent on the resistance in the two paths.

In either event, the DMCs 26 and 28 share the power to the PD 35 so the current requirements of each DMC are reduced by about 50%.

The DMC 26 windings are fabricated to have a high magnetic coupling coefficient, such as greater than 0.95, and preferably greater than 0.99. This is sometimes referred to as the windings being "tightly coupled". The coupling coefficient is typically specified in a DMC data sheet and may be specified as a percentage or a coefficient between 0 and 1, such as 0.95. It can sometimes be specified via a leakage inductance value and, in such a case, the coupling coefficient can be calculated using the open circuit inductance and the leakage inductance. With strong magnetic coupling, there is low leakage inductance. As such, the strongly coupled DMC 26 presents substantially zero impedance to high frequency AC common mode noise, whether supplied by the wires 14 and 16 or by the PHY 10. The power supply 24 has a low impedance to ground (typical of a voltage source). RC termination circuitry, comprising the termination resistors R1 and R2 and capacitors C3 and C4, typically presents an impedance generally matched to the common mode impedance of the wires 14 and 16 for minimum reflection of common mode noise. Other types of termination circuitry may be used.

On the other hand, the DMC 28 is "loosely coupled", meaning that it has a low magnetic coupling coefficient, for example, below 0.70. Due to its high leakage inductance, its impedance to AC common mode noise is high enough so that its impedance does not adversely affect the performance of the RC termination circuitry.

In series between the capacitors C1 and C2 and the wires 14 and 16 are CMCs 32 and 34. The CMCs 32 and 34 have split windings around a common magnetic core. The CMCs 32 and 34 present a high impedance to common mode noise and a low impedance to differential data signals. In a split winding configuration, the "top" and "bottom" windings (with respect to the drawing) have "taps" in the windings which allow a connection between each winding. The windings can also be wound as four separate wires with appropriate winding orientation (clockwise or anticlockwise) and then later be connected to get a similar structure. The windings are "tightly wound" around the core.

The CMCs 32 and 34 thus form a single component. By forming two CMCs using a single core, there is benefit in the cost and size compared to an additional CMC. Also, the effective open circuit inductance of the CMCs is higher due to the mutual coupling between the windings compared with uncoupled cascaded CMCs of same individual open circuit inductances. This higher open circuit inductance can be used to optimize the CMC design by either reducing the individual open circuit inductances or by achieving a higher common mode insertion loss.

Also, having a connection between the two CMCs 32 and 34 helps in reducing the common mode to differential mode conversion caused by imbalance in the windings of the DMC 26. The common mode signal is attenuated by either section of the CMC before it is converted to differential mode by the DMC 26. Hence, the same amount of imbalance causes a lesser mode conversion as the DMC 26 is subjected to an attenuated common mode signal. This is significant because mode conversion might cause electromagnetic immunity and electromagnetic compatibility issues. Further benefits and optimizations have been described earlier.

As in all embodiments, the CMC winding can be more insulated or otherwise further separated to reduce parasitic capacitance, to improve the high frequency common mode insertion loss.

Since the combination of the functions of the CMCs 32/34 and the DMCs 26/28 greatly attenuates AC common mode noise, and the RC termination circuitry prevents reflections of this noise, there is improved performance in a high electromagnetic interference (EMI) environment.

Both DMCs 26 and 28 couple the low frequency DC voltage outputs of the power supply 24 to the wires 14 and 16 with low voltage drop.

For classifying a DMC as being tightly coupled, the coupling coefficient should be high enough to result in a low enough leakage inductance that presents a low impedance to common mode signals in the frequency range of interest. For classifying a DMC as being loosely coupled, the coupling coefficient should be low enough to result in a high enough leakage inductance that presents a high impedance to common mode signals in the frequency range of interest so that the equivalent impedance of the common mode termination circuitry is not significantly altered.

For classifying a DMC as being tightly coupled, the coupling coefficient should be 0.85 or greater, and preferably greater than 0.95. For classifying a DMC as being loosely coupled, the coupling coefficient should be less than 0.75, and preferably less than 0.70.

The AC-coupling capacitors C1 and C2 block the DC voltage but pass the differential data signals. An isolation transformer may be used instead.

Since the windings in the CMC 34 have some resistance, there will be a voltage drop across the CMC 34. If it is desired for both DMCs 26 and 28 to supply precisely the same current to the PD, a multiphase power supply can be used. Sharing current reduces the current requirements of both DMCs 26 and 28, reducing their cost and size. Additionally, since the CMC 34 only needs to pass about half the total PD current, the current requirements of the CMC 34 are reduced by about 50%, reducing its cost and size.

Some of the contributing factors of the reduced size and cost of the CMC 34 can be the use of a thinner gauge winding wire and a smaller volume for thermal dissipation. Reducing the open circuit inductance of the CMC 34 also has benefits, since a fewer number of winding turns are required to achieve the desired open circuit inductance. This can mean a reduced size of the CMC 34 or the use of a thicker wire gauge in the same volume. A thicker wire gauge reduces the DC resistance of the CMC 34 and it can possibly be used at a higher current owing to the lower thermal dissipation. A reduced number of turns can also help in achieving a lower parasitic winding capacitance, which can help in improving the common mode insertion loss.

The DMCs 26 and 28 may share the same core, to reduce space and cost, or can be separate.

Figure 1:
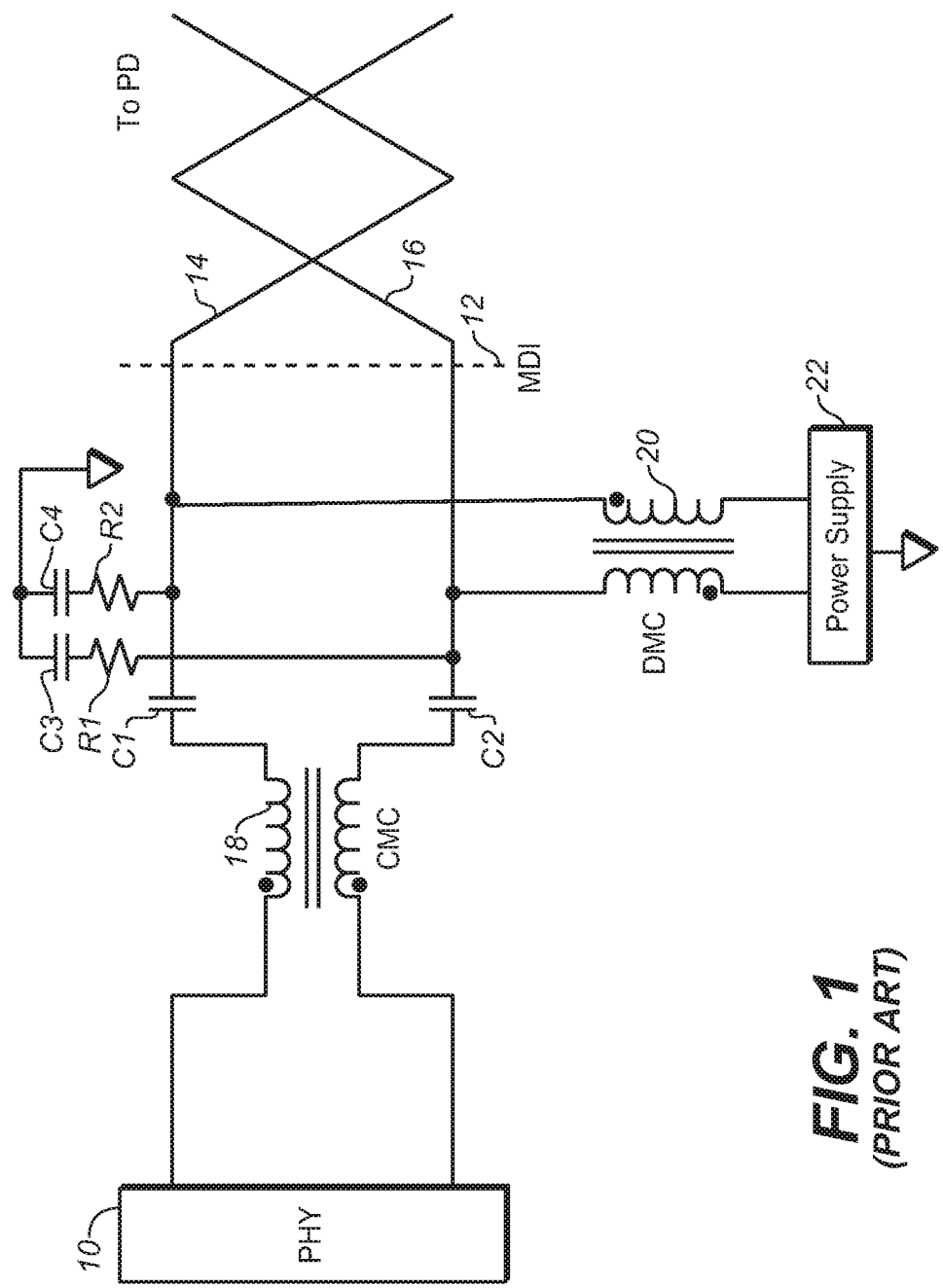
FIG. 1 illustrates a prior art PoDL circuit where a single DMC, on the line side of a CMC, conducts DC voltage and passes AC common mode noise.
Figure 2:
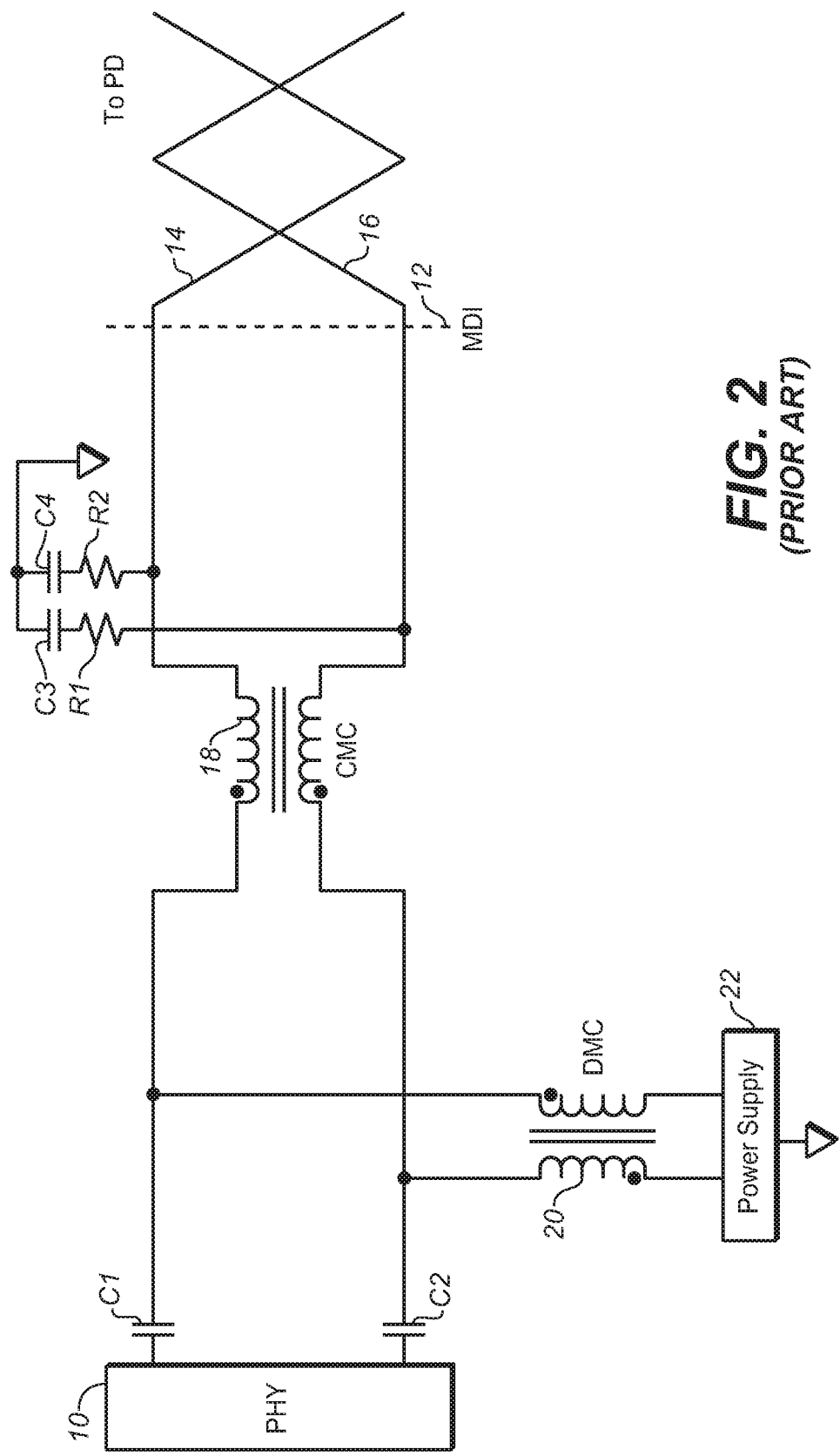
FIG. 2 illustrates a prior art PoDL circuit where a single DMC, on the PHY side of a CMC, conducts DC voltage and passes AC common mode noise.

Although it was mentioned that the current through the CMC 34 can be about 50% less for the same PD current, the same "full current" CMC as the prior art FIG. 2 may be use while providing about double the current to the PD.

Figure 4:
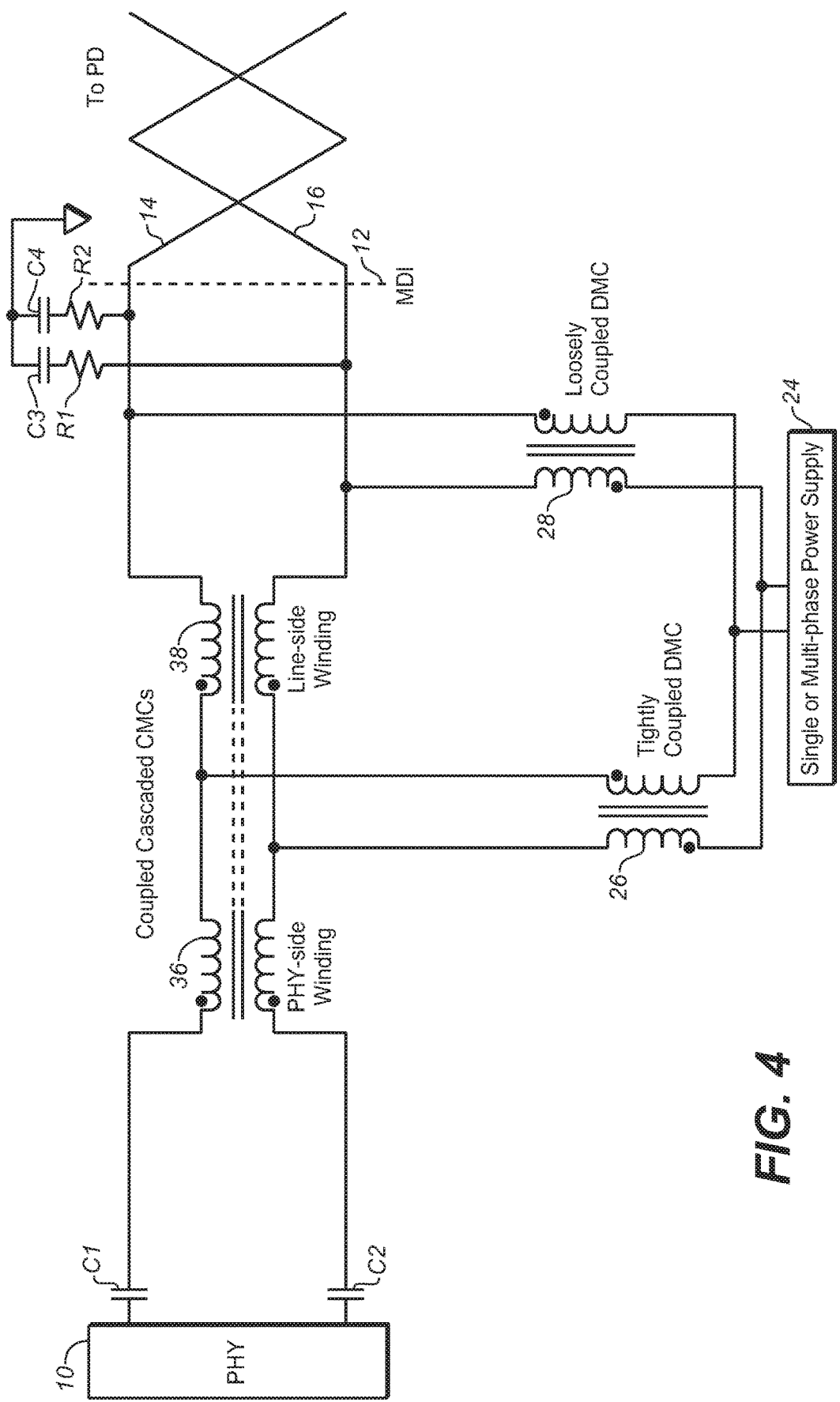
FIG. 4 is similar to FIG. 3 except that the CMCs are two distinct CMCs having separate windings wound around the same core, so they are magnetically coupled.

FIG. 4 is similar to FIG. 3 except that the CMCs 36 and 38 have their separate windings wound around the same core, so they are magnetically coupled. The magnetically coupled CMCs 36/38 are cascaded. This improves the attenuation of AC common mode noise. The open circuit inductance (OCL) is higher due to mutual coupling with this configuration compared to using two non-magnetically-coupled CMCs (i.e., two separate CMCs in series), enabling higher data rates.

Figure 5:
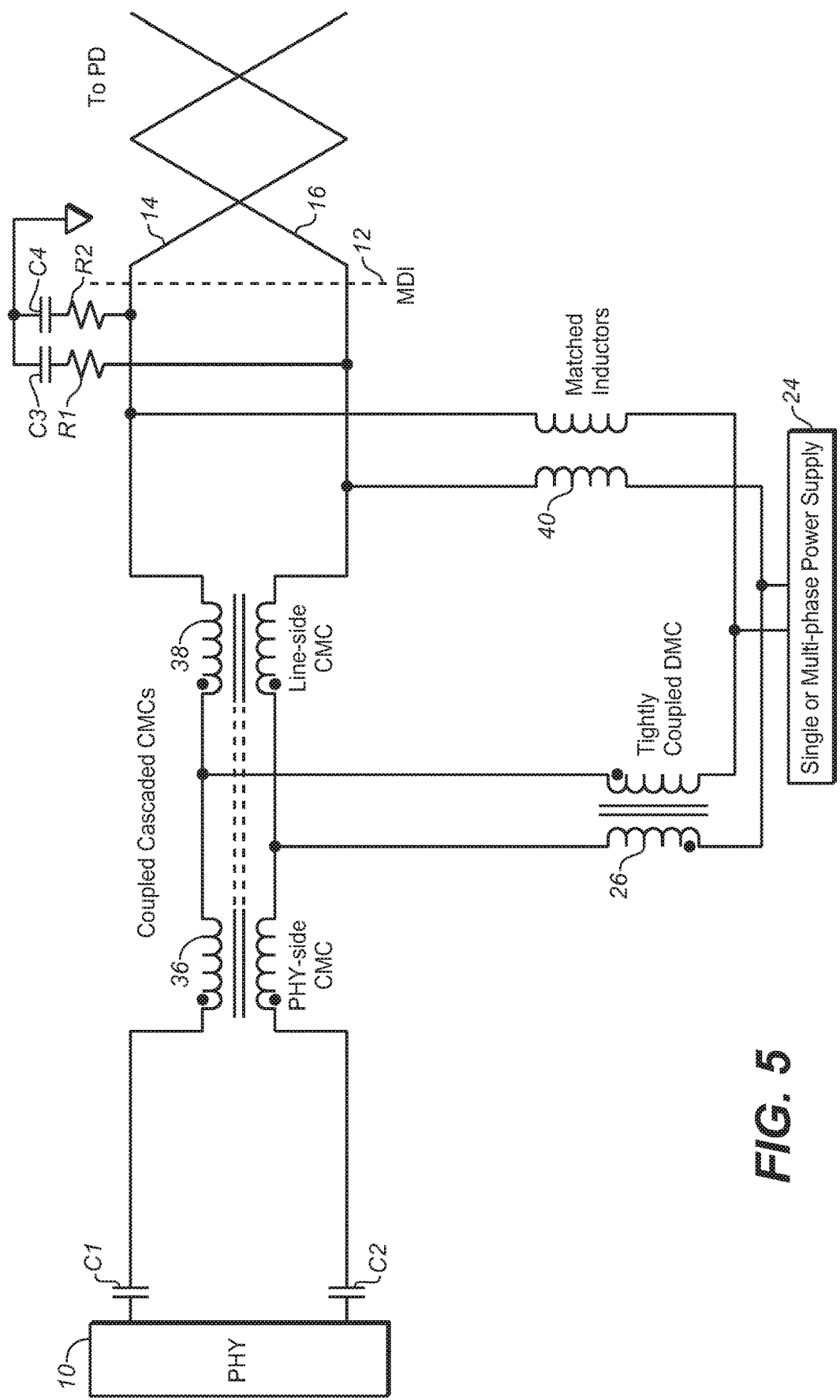
FIG. 5 is similar to FIG. 4 except that the loosely coupled DMC is replaced by matched inductors.

FIG. 5 is similar to FIG. 4 except that the DMC 28 has been replaced with matched inductors 40. The matched inductors 40 pass the DC voltage but present a high impedance to the AC common mode noise and the differential data. All the AC common mode noise attenuation is accomplished by the CMCs 32/34 and tightly coupled DMC 26. The matched inductors 40 may be replaced with a third CMC.

Figure 6:
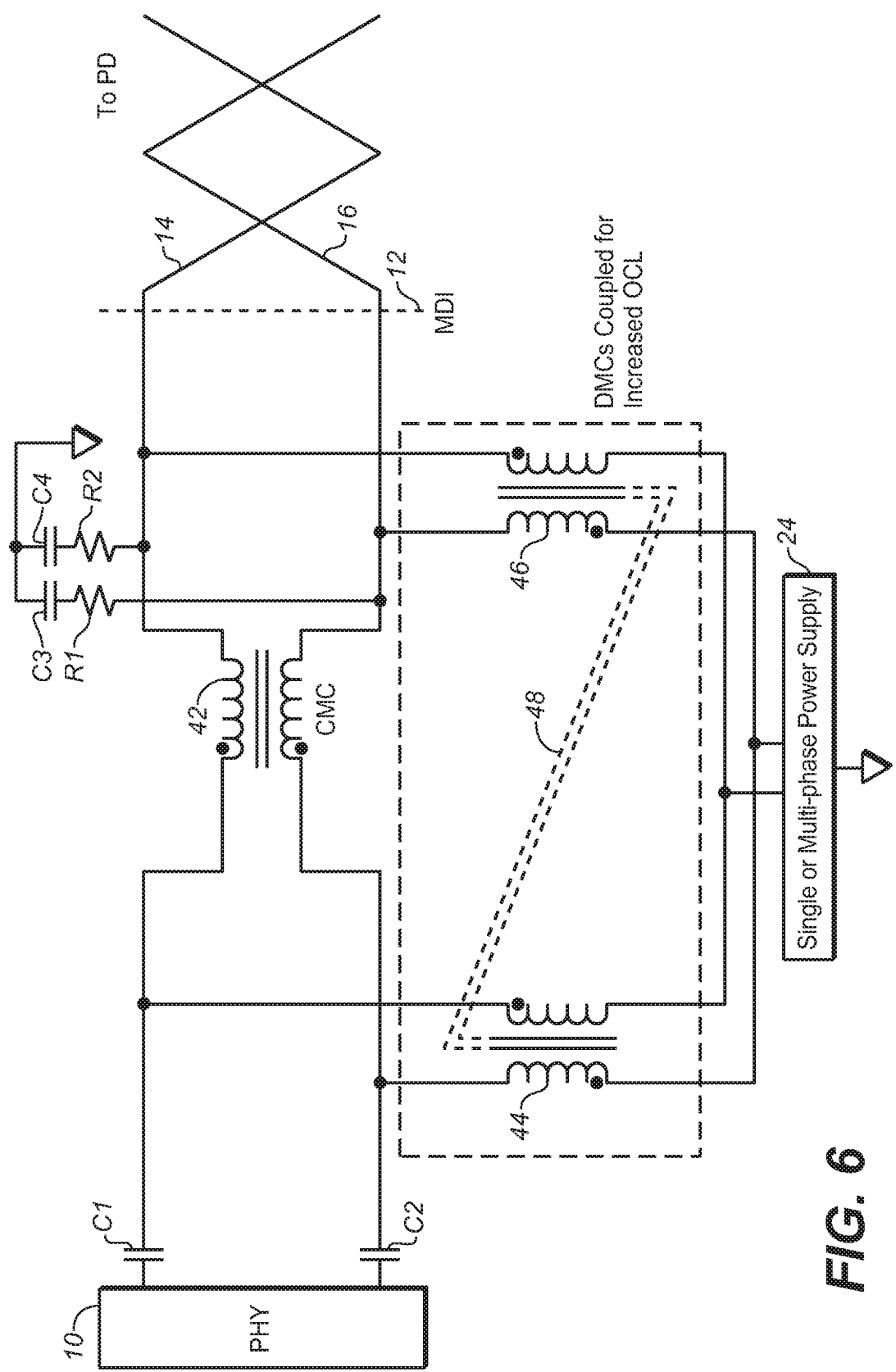
FIG. 6 illustrates an embodiment where the two DMCs and have windings wound around the same core.

FIG. 6 illustrates an embodiment where the two DMCs 44 and 46 are connected to respective sides of the CMC 42. The DMCs 44/46 have windings wound around the same core 48 so they are magnetically coupled. The two DMCs 44/46 are wound on same core 48 to eliminate the need for doubling their individual OCLs (parallel DMCs would halve the inductance). Having a high inductance value is desirable for blocking differential data signals. With simultaneous power injection, there is a concern about the OCL of the DMCs 44/46. If the DMCs 44/46 were separate DMCs connected in parallel, their effective inductance would be half of the inductance of the windings. To maintain a high inductance, for passing DC voltage and blocking differential data, the DMC windings are wound around the same core 48. Through the mutual coupling of the windings, the effective inductance for differential signals remains same as for a single DMC. We can also alter the coupling coefficient for the two DMCs as needed.

Further, the mutually coupled DMCs help to reduce the differential mode insertion loss of the CMC 42 by allowing the differential mode data signals to circumvent the CMC 42 due to the coupled nature of the DMC windings.

For winding the magnetically coupled DMCs or CMCs in the various embodiments, an example winding scheme can be a "2-in-hand" technique. For example, to couple the two DMCs, we can visualize the winding scheme coupling the two windings in one path to the two windings in the other path. Hence, the 4 winding device can be simplified by winding 2 pairs of windings each with a "2-in-hand" technique.

Figure 7:
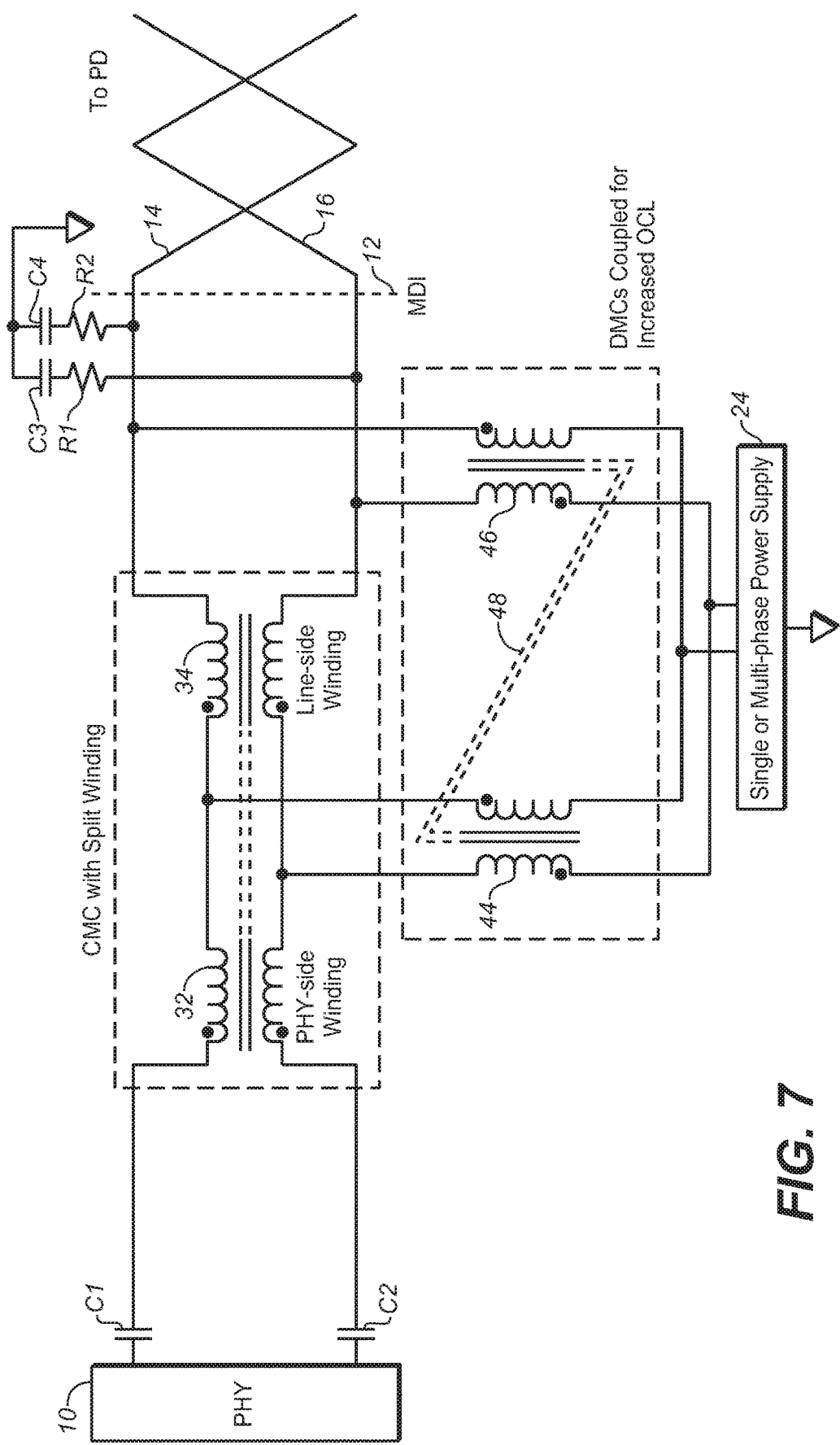
FIG. 7 is a combination of the DMCs of FIG. 6 and the CMCs of FIG. 3, having the benefits of each.

FIG. 7 is a combination of the DMCs 44/46 of FIG. 6 and the CMCs 32/34 of FIG. 3, having the benefits of each. The CMCs 36/38 of FIG. 4 may also be used.

Although only the power injecting side of the PoDL system is shown in the figures, the differential data path of the PD side (including RC terminations and CMC configurations) may be identical to that shown in the power injecting side for attenuating AC common mode noise and minimizing reflections. On the PD side, DC decoupling circuitry is connected between the wire pair and the PD load to power the PD load.

Any combinations of the features of the various figures may be combined to realize the various advantages described herein.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A Power over Data Lines (PoDL) circuit for connection to a first wire and a second wire of a wire pair comprising:
    a transceiver having a first terminal and a second terminal, the transceiver for transmitting differential data over the first wire and the second wire and receiving differential data from the first wire and the second wire;
    a first AC-coupling device coupled to the first terminal;
    a second AC-coupling device coupled to the second terminal;
    a first common mode choke (CMC) having a first winding coupled to the first AC-coupling device and having a second winding coupled to the second AC-coupling device;
    a second CMC having a first winding coupled in series between the first winding of the first CMC and a third terminal of the PoDL circuit for coupling to the first wire, the second CMC having a second winding coupled in series between the second winding of the first CMC and a fourth terminal of the PoDL circuit for coupling to the second wire,
    wherein the first CMC and the second CMC share a common magnetic core;
    termination circuitry coupled to the third terminal and the fourth terminal for terminating the first wire and the second wire to reduce reflections;
    a first differential mode choke (DMC) having a first pair of terminals coupled to nodes between the first CMC and the second CMC, and having a second pair of terminals configured to be coupled to a power supply; and
    a pair of inductors having a third pair of terminals coupled to nodes between the second CMC and the third terminal and the fourth terminal, and having a fourth pair of terminals configured to be coupled to the power supply.

2. The circuit of claim 1 further comprising the power supply coupled to nodes between the first DMC and the pair of inductors for supplying a DC voltage across the first DMC and across the pair of inductors, such that DC power and the differential data are transmitted over the first wire and the second wire.

3. The circuit of claim 2 wherein the power supply is a multiphase power supply that supplies power to the first DMC and the pair of inductors.

4. The circuit of claim 2 wherein the power supply is a single-phase power supply that simultaneously supplies power to the first DMC and the pair of inductors.

5. The circuit of claim 2 further comprising a powered device coupled to the wire pair for being powered by the power supply.

6. The circuit of claim 1 wherein the pair of inductors comprises a second DMC.

7. The circuit of claim 6 wherein the first DMC has windings with a magnetic coupling coefficient greater than 0.85, and wherein the second DMC has windings with a magnetic coupling coefficient less than 0.75.

8. The circuit of claim 6 wherein the first DMC and the second DMC share the same magnetic core.

9. The circuit of claim 1 wherein the first DMC has a magnetic coupling coefficient greater than 0.95.

10. The circuit of claim 1 wherein the first AC-coupling device comprises a first capacitor, and wherein the second AC-coupling device comprises a second capacitor.

11. The circuit of claim 1 wherein the pair of inductors comprises a matched pair of inductors.

12. The circuit of claim 1 wherein the termination circuitry comprises a resistor-capacitor circuit coupled to the third terminal and the fourth terminal.

13. The circuit of claim 12 wherein the resistor-capacitor circuit comprises:
    a first resistor and a first capacitor connected between the third terminal and ground; and
    a second resistor and a second capacitor connected between the fourth terminal and ground.

14. The circuit of claim 1 wherein the third terminal and the fourth terminal are connected to the wire pair.

15. The circuit of claim 1 wherein the first CMC and the second CMC have split windings.

16. The circuit of claim 1 wherein the first CMC and the second CMC are cascaded.

17. A Power over Data Lines (PoDL) circuit for connection to a first wire and a second wire of a wire pair comprising:
    a transceiver having a first terminal and a second terminal, the transceiver for transmitting differential data over the first wire and the second wire and receiving differential data from the first wire and the second wire;

a first AC-coupling device coupled to the first terminal;

a second AC-coupling device coupled to the second terminal;

a first common mode choke (CMC) having a first winding coupled in series between the first AC-coupling device and a third terminal of the PoDL circuit for connection to the first wire, and a second winding coupled in series between the second AC-coupling device and a fourth terminal of the PoDL circuit for connection to the second wire;

termination circuitry coupled to the third terminal and the fourth terminal for terminating the first wire and the second wire to reduce reflections;

a first differential mode choke (DMC) having a first pair of terminals coupled to nodes between the first CMC and the transceiver, and having a second pair of terminals configured to be coupled to a power supply; and a second DMC having a third pair of terminals coupled to nodes between the first CMC and the third terminal and the fourth terminal, and having a fourth pair of terminals configured to be coupled to the power supply, wherein the first DMC and the second DMC share a same magnetic core.

18. The circuit of claim 17 further comprising the power supply coupled to nodes between the first DMC and the second DMC for supplying a DC voltage across the first DMC and across the second DMC, such that DC power and the differential data are transmitted over the first wire and the second wire.

19. The circuit of claim 18 wherein the power supply is a multiphase power supply that supplies power to the first DMC and the second DMC.

20. The circuit of claim 18 wherein the power supply is a single phase power supply that simultaneously supplies power to the first DMC and the second DMC.

21. The circuit of claim 17 further comprising a second CMC having a first winding coupled in series between the first winding of the first CMC and the first AC-coupling device, the second CMC having a second winding coupled in series between the second winding of the first CMC and the second AC-coupling device, wherein the first DMC is coupled to nodes between the first CMC and the second CMC.

22. The circuit of claim 17 wherein the first DMC has windings with a magnetic coupling coefficient greater than 0.85, and wherein the second DMC has windings with a magnetic coupling coefficient less than 0.75.

23. A method performed by a Power over Data Lines (PoDL) circuit connected to a first wire and a second wire of a wire pair comprising:

transmitting differential data over the first wire and the second wire and receiving the differential data from the first wire and the second wire by a transceiver having a first terminal and a second terminal;

blocking DC voltages from being applied to the first terminal and the second terminal;

conducting the differential data through a first common mode choke (CMC) having a first winding coupled to a first AC-coupling device and having a second winding coupled to a second AC-coupling device;

conducting the differential data through a second CMC having a first winding coupled in series between the first winding of the first CMC and a third terminal of the PoDL circuit for coupling to the first wire, the second CMC having a second winding coupled in series between the second winding of the first CMC and a fourth terminal of the PoDL circuit for coupling to the second wire, wherein the first CMC and the second CMC share a common magnetic core;

terminating the first wire and the second wire with termination circuitry to reduce reflections; and supplying DC power to the wire pair by a power supply coupled to a first differential mode choke (DMC) and a second DMC, such that DC power and the differential data are transmitted over the first wire and the second wire, wherein the first DMC has a first pair of terminals coupled to nodes between the first CMC and the second CMC, and has a second pair of terminals coupled to the power supply, and wherein the second DMC has a third pair of terminals coupled to nodes between the second CMC and the wire pair, and has a fourth pair of terminals coupled to the power supply.

24. The method of claim 23 wherein the first DMC has windings with a magnetic coupling coefficient greater than 0.85, and wherein the second DMC has windings with a magnetic coupling coefficient less than 0.75.

* * * * *